(12) United States Patent
Lim et al.

(10) Patent No.: US 10,706,920 B2
(45) Date of Patent: Jul. 7, 2020

(54) MEMORY DEVICE

(71) Applicant: SAMSUNG ELECTRONICS CO., LTD., Suwon-si, Gyeonggi-do (KR)

(72) Inventors: Chea Ouk Lim, Hwaseong-si (KR); Tae Hui Na, Seoul (KR); Jung Sunwoo, Seoul (KR); Yong Jun Lee, Hwaseong-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 16/100,295

(22) Filed: Aug. 10, 2018

(65) Prior Publication Data

US 2019/0130969 A1    May 2, 2019

(30) Foreign Application Priority Data

Nov. 2, 2017  (KR) .................. 10-2017-0145467
Mar. 19, 2018 (KR) .................. 10-2018-0031600

(51) Int. Cl.
*G11C 13/00*   (2006.01)
*G11C 11/56*   (2006.01)

(52) U.S. Cl.
CPC ...... *G11C 13/0004* (2013.01); *G11C 11/5678* (2013.01); *G11C 13/004* (2013.01); *G11C 13/0069* (2013.01); *G11C 13/003* (2013.01); *G11C 2013/0045* (2013.01); *G11C 2013/0052* (2013.01); *G11C 2013/0092* (2013.01); *G11C 2213/72* (2013.01); *G11C 2213/76* (2013.01)

(58) Field of Classification Search
CPC ............ G11C 13/0004; G11C 11/5678; G11C 13/0069
USPC ......................................................... 365/148
See application file for complete search history.

(56) References Cited

U.S. PATENT DOCUMENTS

| 7,571,901 | B2 | 8/2009  | Philipp         |
| 7,787,278 | B2 | 8/2010  | Bae et al.      |
| 7,978,508 | B2 | 7/2011  | Czubatyj        |
| 8,228,722 | B2 | 7/2012  | Savransky et al.|
| 8,908,414 | B2 | 12/2014 | Boniardi et al. |
| 8,958,233 | B2 | 2/2015  | Chen            |
| 9,378,830 | B2 | 6/2016  | Khoueir et al.  |
| 9,558,823 | B1 | 1/2017  | Khwa et al.     |
| 9,627,055 | B1 | 4/2017  | Robustelli      |

(Continued)

OTHER PUBLICATIONS

Search Report and Written Opinion issued in corresponding Singapore patent Application No. 10201808376V dated Apr. 4, 2019.

*Primary Examiner* — Anthan Tran
(74) *Attorney, Agent, or Firm* — F. Chau & Associates, LLC

(57) ABSTRACT

A memory device includes: a memory cell array including a plurality of memory cells, wherein each of the plurality of memory cells includes a switching element, and a data storage element connected to the switching element, wherein the data storage element includes a phase change material; and a memory controller configured to perform a control operation with respect to a first memory cell of the plurality of memory cells by inputting an operating current to the first memory cell, and inputting a compensation current flowing from the data storage element to the switching element in the first memory cell before or after inputting the operating current to the first memory cell.

19 Claims, 14 Drawing Sheets

(56) References Cited

U.S. PATENT DOCUMENTS

| | | |
|---|---|---|
| 2004/0022085 A1 | 2/2004 | Parkinson et al. |
| 2006/0203542 A1 | 9/2006 | Kurotsuchi et al. |
| 2006/0233019 A1 | 10/2006 | Kostylev et al. |
| 2008/0266942 A1* | 10/2008 | Jeong ............... G11C 11/56 365/163 |
| 2009/0010048 A1 | 1/2009 | Fuji |
| 2014/0160864 A1* | 6/2014 | Won ............... G11C 5/147 365/189.09 |

* cited by examiner

MEMORY DEVICE

CROSS-REFERENCE TO RELATED APPLICATION(S)

This application claims priority under 35 U.S.C. § 119 to Korean Patent Application No. 10-2017-0145467 filed on Nov. 2, 2017, and Korean Patent Application No. 10-2018-0031600 filed on Mar. 19, 2018 in the Korean Intellectual Property Office, the disclosures of which are incorporated by reference herein in their entireties.

1. TECHNICAL FIELD

The present inventive concept relates to a memory device.

2. DESCRIPTION OF RELATED ART

A memory device using resistance may include a phase change random access memory (PRAM), a resistive RAM (ReRAM), a magnetic RAM (MRAM), or the like. Such devices are a type of nonvolatile RAM. A memory device using resistance may write or erase data using a change in resistance.

SUMMARY

According to an exemplary embodiment of the present inventive concept, a memory device includes: a memory cell array including a plurality of memory cells, wherein each of the plurality of memory cells includes a switching element, and a data storage element connected to the switching element, wherein the data storage element includes a phase change material; and a memory controller configured to perform a control operation with respect to a first memory cell of the plurality of memory cells by inputting an operating current to the first memory cell, and inputting a compensation current flowing from the data storage element to the switching element in the first memory cell before or after inputting the operating current to the first memory cell.

According to an exemplary embodiment of the present inventive concept, a memory device includes: a memory cell array including a plurality of memory cells, wherein each of the plurality of memory cells includes a first electrode, a switching element connected to the first electrode, a data storage element connected to the switching element, and a second electrode connected to the data storage element; and a memory controller configured to read data stored in a first memory cell of the plurality of memory cells by inputting a reading current to the first memory cell, wherein the memory controller is further configured to input a compensation current to the second electrode of the first memory cell before or after inputting the reading current.

According to an exemplary embodiment of the present inventive concept, a memory device includes: a memory cell array including a plurality of memory cells, wherein each of the plurality of memory cells includes a first electrode, a switching element connected to the first electrode, a data storage element connected to the switching element, and a second electrode connected to the data storage element; and a memory controller configured to store data in a first memory cell of the plurality of memory cells by inputting a program current to the first memory cell, wherein the memory controller is further configured to input a compensation current to the second electrode of the first memory cell after inputting the program current.

According to an exemplary embodiment of the present inventive concept, a memory device includes: a memory cell array including a plurality of memory cells, wherein at least one of the memory cells includes a switching element and a data storage element, wherein the data storage element includes a phase change material; and a memory controller configured to provide a compensation current to the data storage element, wherein the compensation current is provided before or after an operation current is applied to the data storage element.

BRIEF DESCRIPTION OF THE DRAWINGS

The above and other features of the present inventive concept will be more clearly understood by describing in detail exemplary embodiments thereof with reference to the accompanying drawings, in which.

DETAILED DESCRIPTION OF THE EMBODIMENTS

Figure 1:
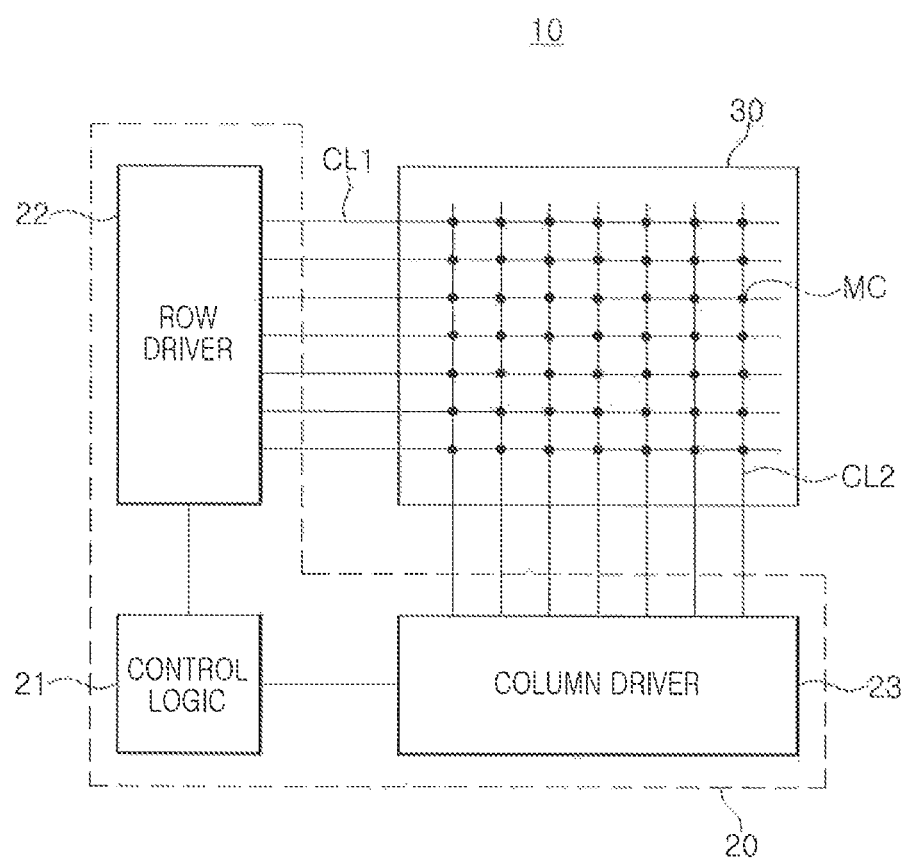
FIG. 1 is a block diagram illustrating a memory device according to an exemplary embodiment of the present inventive concept.

Hereinafter, exemplary embodiments of the present inventive concept will be described in detail with reference to the accompanying drawings. In the drawings, like reference numerals may refer to like elements.

Figure 2:
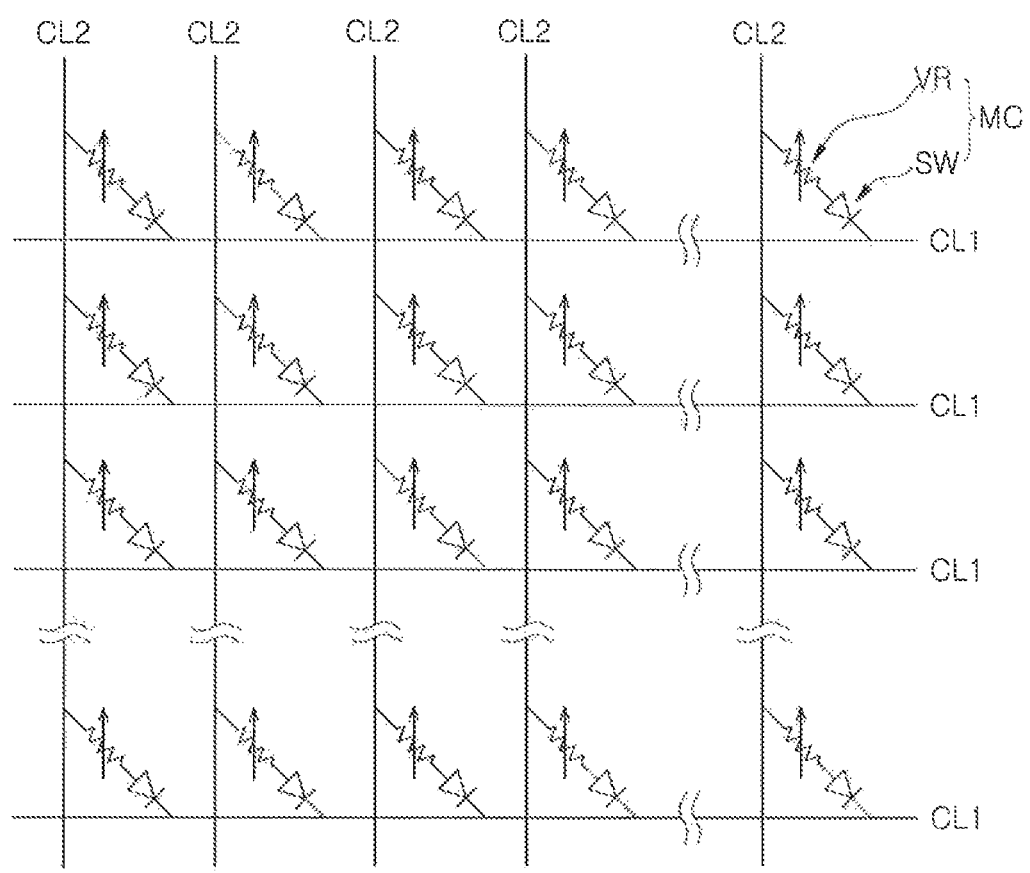
FIG. 2 is a schematic view illustrating a memory cell array included in a memory device according to an exemplary embodiment of the present inventive concept.

FIG. 1 is a block diagram illustrating a memory device according to an exemplary embodiment of the present inventive concept. FIG. 2 is a schematic view illustrating a memory cell array included in a memory device according to an exemplary embodiment of the present inventive concept.

First, referring to FIG. 1, a memory device 10 according to an exemplary embodiment of the present inventive concept may include a memory controller 20 and a memory cell array 30. The memory controller 20 may include a control logic 21, a row driver 22, a column driver 23, and the like. The memory cell array 30 may include a plurality of memory cells MC.

In an exemplary embodiment of the present inventive concept, the row driver 22 may be connected to the memory cells MC through a first conductive line CL1, while the column driver 23 may be connected to the memory cells MC through a second conductive line CL2. As shown in FIG. 1, the first conductive line CL1 may be provided in plural and the second conductive line CL2 may be provided in plural. In an exemplary embodiment of the present inventive concept, the row driver 22 may include an address decoder circuit for selecting a memory cell MC for writing data to or reading data from, and the column driver 23 may include a read/write circuit for writing data to the memory cell MC, or reading data from the memory cell MC. Operations of the row driver 22 and the column driver 23 may be controlled by the control logic 21. The row driver 22 and the column driver 23 may be connected to the memory cell MC through the first conductive line CL1 and the second conductive line CL2, respectively. For example, the first conductive line CL1 and the second conductive line CL2 may correspond to a word line and a bit line, respectively. In other words, the first conductive line CL1 may refer to a plurality of word lines, and the second conductive line CL2 may refer to a plurality of bit lines.

Referring to FIG. 2, a memory cell array 30 according to an exemplary embodiment of the present inventive concept may include a plurality of the memory cells MC. The memory cells MC may be provided where the first conductive line CL1 and the second conductive line CL2 intersect. In other words, each of the memory cells MC may be connected to a single first conductive line CL1 and a single second conductive line CL2. For example, a memory cell MC may be connected to a first word line and a first bit line.

Each of the memory cells MC may include a switching element SW and a data storage element VR. In an exemplary embodiment of the present inventive concept, the switching element SW may include at least one of a PN junction diode, a Schottky diode, and an ohmic threshold switch (OTS). In addition, in an exemplary embodiment of the present inventive concept, the data storage element VR may be formed of a phase change material having a chalcogenide material or a super-lattice material. In other words, the data storage element VR may include a phase change material whose phase can be changed between an amorphous phase and a crystalline phase according to a heating time, a temperature, or the like. The data storage element VR and the switching element SW may be connected to each other in series.

The memory controller 20 causes a phase of a phase change material of the data storage element VR included in each of a plurality of memory cells MC to be changed to an amorphous phase or a crystalline phase, by providing signals through the first conductive line CL1 and the second conductive line CL2, thereby writing or erasing data. In an exemplary embodiment of the present inventive concept, the memory controller 20 may cause a phase of a phase change material of the data storage element VR included in a first memory cell MC to be changed to an amorphous phase, thereby increasing a resistance of the data storage element VR and writing data to the first memory cell MC. The memory controller 20 may cause a phase of a phase change material of the data storage element VR included in the first memory cell MC to be changed to a crystalline phase, thereby reducing the resistance of the data storage element VR included in the first memory cell MC and erasing data from the first memory cell MC. The memory controller 20 may detect a resistance or a threshold voltage of the data storage element VR included in each of the plurality of memory cells MC, to thereby read data from each of the plurality of memory cells MC.

Figure 3:
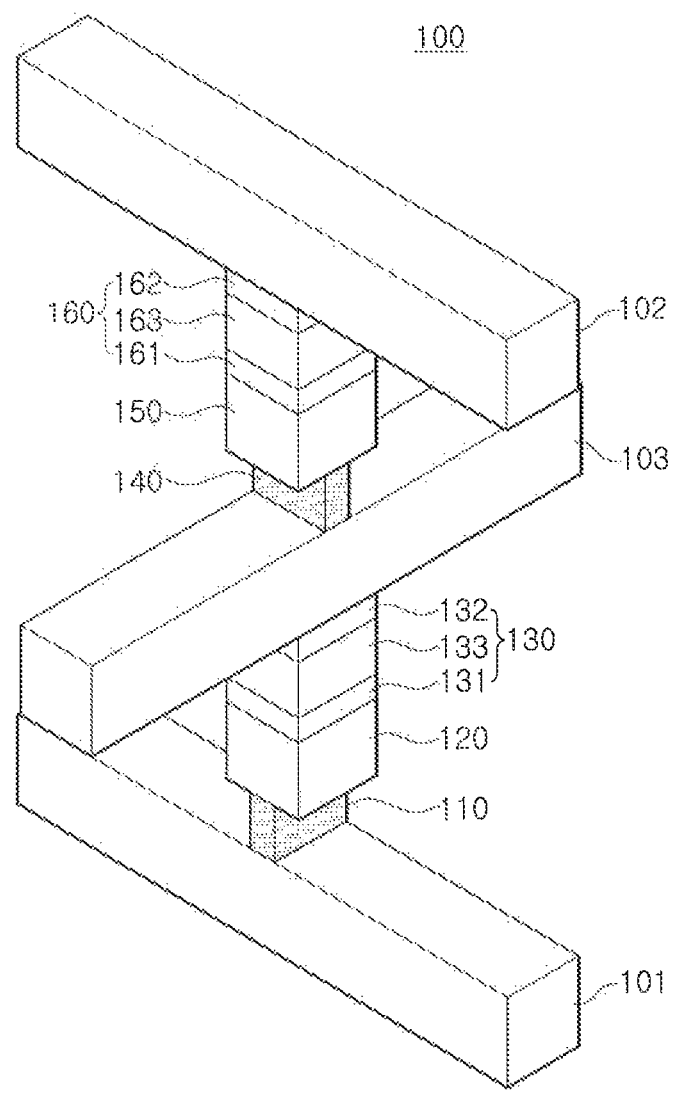
FIG. 3 is a schematic view illustrating a structure of a memory cell included in a memory device according to an exemplary embodiment of the present inventive concept.

FIG. 3 is a schematic view illustrating a structure of a memory cell included in a memory device according to an exemplary embodiment of the present inventive concept.

Referring to FIG. 3, a memory device 100 according to an exemplary embodiment of the present inventive concept may include a first memory cell MC1 provided between a first word line 101 and a bit line 103, as well as a second memory cell MC2 provided between a second word line 102 and the bit line 103. Each of the first memory cell MC1 and the second memory cell MC2 may be operated as an independent memory cell MC.

The first memory cell MC1 may include a first heating electrode 110, a first data storage element 120, a first switching element 130, and the like. The first switching element 130 may include a first switching electrode 131 and a second switching electrode 132, a first selective layer 133 disposed therebetween, and the like. In an exemplary embodiment of the present inventive concept, the first selective layer 133 may include an ovonic threshold switch (OTS) material. When a voltage, greater than a threshold voltage, is applied between the first switching electrode 131 and the second switching electrode 132, a current may flow through the first selective layer 133.

The first data storage element 120 may include a phase change material, for example, a chalcogenide material. For example, the first data storage element 120 may include Ge—Sb—Te (GST). A crystallization temperature, a melting point, a phase change rate depending on crystallization energy, and the like of the first data storage element 120 may be determined by a type of element included in the first data storage element 120 and a chemical composition ratio thereof.

The second memory cell MC2 may have a structure similar to that of the first memory cell MC1. Referring to FIG. 3, the second memory cell MC2 may include a second heating electrode 140, a second data storage element 150, a second switching element 160, and the like. The structure and characteristics of the second heating electrode 140, the second data storage element 150, and the second switching element 160 may be similar to those of the first heating electrode 110, the first data storage element 120, and the first switching element 130. For example, the second switching element 160 may include a third switching electrode 161 and a fourth switching electrode 162, a second selective layer 163 disposed therebetween. Hereinafter, a method of writing and erasing data will be described using the first memory cell MC1 as an example.

When a voltage is supplied through the first word line 101 and the bit line 103, Joule heat, caused by the voltage, may occur at an interface between the first heating electrode 110 and the first data storage element 120. Due to the Joule heat, a phase change material of the first data storage element 120 may be changed from an amorphous phase to a crystalline phase or from a crystalline phase to an amorphous phase. The first data storage element 120 may have a high resistance in an amorphous phase and may have a low resistance in a crystalline phase. In an exemplary embodiment of the present inventive concept, data '0' or '1' may be determined according to a resistance value of the first data storage element 120.

To write data to the first memory cell MC1, a program voltage may be supplied through the first word line 101 and the bit line 103. The program voltage is greater than a threshold voltage of an ovonic threshold switch (OTS) material included in the first switching element 130, so that a current may flow through the first switching element 130. A phase change material included in the first data storage element 120 may be changed from an amorphous phase to a crystalline phase by the program voltage, so that data can be written to a first memory area. In an exemplary embodiment of the present inventive concept, a case in which a phase change material included in the first data storage element 120 has a crystalline phase may be referred to as a set state.

In addition, to erase data written to the first memory cell MC1, the phase change material included in the first data storage element 120 may be changed from the crystalline phase to the amorphous phase. For example, a predetermined erase voltage may be supplied through the first word line 101 and the bit line 103. Due to the erase voltage, the phase change material included in the first data storage element 120 may be changed from a crystalline phase to an amorphous phase. For example, a maximum value of the erase voltage may be greater than a maximum value of the program voltage, and the time for which the erase voltage is supplied may be shorter than the time for which the program voltage is supplied.

As mentioned previously, according to a state of a phase change material included in the data storage elements 120 and 150, a resistance value of the data storage elements 120 and 150 may be changed, and thus, a memory controller may distinguish data '0' and '1' from the resistance value of the data storage elements 120 and 150. Thus, when a difference in resistance of the data storage elements 120 and 150 caused by a state of a phase change material included in the data storage elements 120 and 150 is large, a memory controller may more accurately write or read data.

Figure 4:
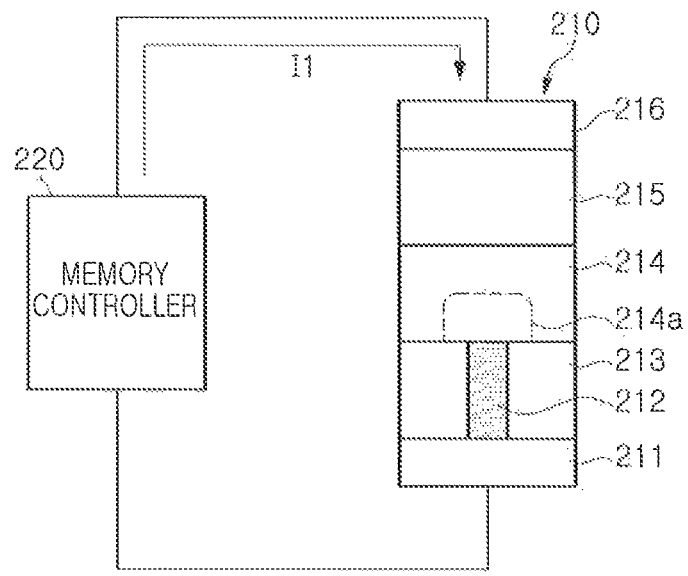
FIGS. 4 and 5 are views illustrating an operation of a memory device according to an exemplary embodiment of the present inventive concept.
Figure 5:
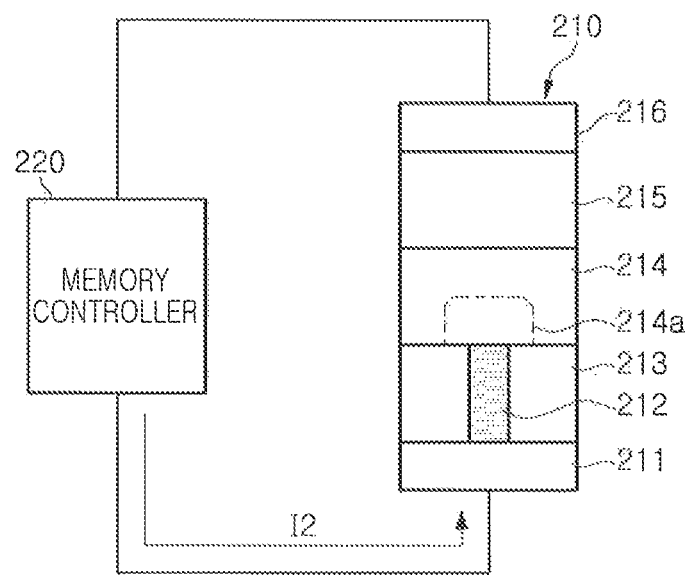

FIGS. 4 and 5 are views illustrating an operation of a memory device according to an exemplary embodiment of the present inventive concept.

A memory device according to an exemplary embodiment of the present inventive concept may be operated by power, which a memory controller 220 supplies to a memory cell 210. Referring to FIGS. 4 and 5, the memory controller 220 may input at least one of a first current I1 flowing in a first direction and a second current I2 flowing in a second direction to the memory cell 210. In an exemplary embodiment of the present inventive concept, the first direction and the second direction may be different from each other. For example, the first direction may proceed from the memory controller 210 to an upper electrode 216 of the memory cell 210 and the second direction may proceed from the memory controller 210 to a lower electrode 211 of the memory cell 210.

The memory cell 210 may include the lower electrode 211, a heating electrode 212, a data storage element 214, a switching element 215, the upper electrode 216, and the like. The lower electrode 211 and the upper electrode 216 may receive a voltage output by the memory controller 220 through a word line, a bit line, or the like. An insulating layer 213 may be provided around the heating electrode 212, and a phase change, caused by the first current I1 or the second current I2, may occur in a portion 214a of the data storage device 214 adjacent to the heating electrode 212.

Referring to FIG. 4, the first current I1 supplied in the first direction by the memory controller 220 may flow to the data storage element 214 from the switching element 215 in the memory cell 210. Referring to FIG. 5, the second current I2 supplied in the second direction may flow to the switching element 215 from the data storage element 214 in the memory cell 210. Thus, due to the Peltier effect, heat generated in the heating electrode 212, may be less when the second current I2 is supplied than when the first current I1 is supplied.

In an exemplary embodiment of the present inventive concept, a programming operation for writing data may be executed by inputting a program current in the first direction. In an exemplary embodiment of the present inventive concept, the data storage element 214 may be changed from a crystalline phase to an amorphous phase by a program current. The memory controller 220 may determine that the memory cell 210 has been programmed, when a resistance of the memory cell 210 is high.

In addition, a reading operation for determining data of the memory cell 210 may be performed by inputting a reading current in the first direction or the second direction. To prevent the data storage device 214 from having an unintentional state change in the memory cell 210 during a reading operation, the reading current may have a magnitude smaller than that of a program current. The memory controller 220 may measure a resistance value of the memory cell 210 by supplying a reading current to the memory cell 210, and may determine whether data is written to the memory cell 210 according to a magnitude of the resistance value.

In a memory device according to an exemplary embodiment of the inventive concept, using a phase change characteristic of the data storage element 214 included in the memory cell 210, data may be written or erased. For example, when the data storage element 214 has a crystalline phase it has a relatively low resistance value, and when the data storage element 214 has an amorphous phase it has a relatively high resistance value; therefore, data '0' and '1' can be programmed and read. Thus, when a difference in voltage detected from the memory cell 210 according to a state of the data storage element 214 is great, the memory controller 220 may accurately read data written to the memory cell 210.

However, a drift phenomenon may occur in the switching element 215, and a difference in voltages detected in the memory cell 210 according to a state of the data storage element 214 may be reduced by the drift phenomenon. For example, due to the drift phenomenon occurring in the switching element 215, a total resistance of the memory cell 210 when the data storage element 214 has a crystalline phase may be increased. As a result, a difference in voltage of the memory cell 210 according to a state of the data storage element 214 may be reduced. Thus, data stored in the memory cell 210 may not be accurately read.

In an exemplary embodiment of the present inventive concept, the memory controller 220 inputs a compensation current to the memory cell 210, before reading data written to the memory cell 210. This way, errors caused by the drift phenomenon may not occur. In an exemplary embodiment of the present inventive concept, the memory controller 220 may input a compensation current in the second direction (e.g., the same way as that of the second current I2), and may only turn the switching element 215 with the compensation current while significantly reducing an effect on the data storage element 214. Thus, an increase in a resistance of the memory cell 210 having the data storage element 214 in a crystalline phase, due to the drift phenomenon occurring in the switching element 215, may be compensated.

In an exemplary embodiment of the present inventive concept, the compensation current may be input, after a reading operation is completed. The compensation current, which is input after the reading operation is completed, may compensate for an increase in a resistance of the memory cell 210, caused by the drift phenomenon of the switching element 215. In the alternative, the compensation current, which is input after the reading operation is completed, may compensate for a resistance in the memory cell 210, which is increased by a reading current. In an alternative embodiment of the present inventive concept, the compensation current may be input before and after a reading operation.

Moreover, in an exemplary embodiment of the present inventive concept, the memory controller 220 supplies a program voltage to the memory cell 210, and then, inputs a compensation current to the memory cell 210 to quickly stabilize the data storage element 214, thereby completing a programming operation. The compensation current, which is input to the memory cell 210 in the programming operation, may be a voltage for supplying energy to cause a drift phenomenon in the data storage element 214 whose phase was changed to an amorphous phase by the program voltage. In this case, the data storage element 214 may be quickly stabilized in an amorphous phase by the compensation current. As a result, a resistance value of the data storage element 214 may be quickly increased. Thus, a difference in a resistance of the memory cell 210 according to a phase change of the data storage element 214 may be increased, so that the memory controller 220 may accurately read data written to the memory cell 210. The compensation current, which is input after the programming operation, may be input in the second direction (e.g., the same as that of the second current I2), to significantly reduce an effect on the memory cell 210.

Figure 6A:
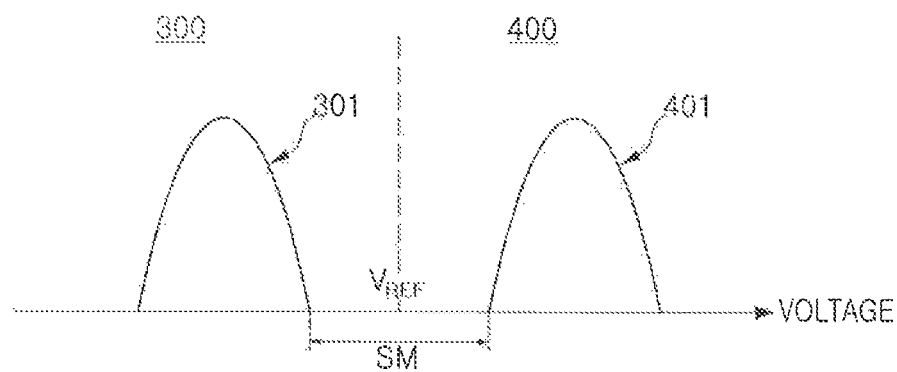
FIGS. 6A and 6B are views illustrating an operation of a memory device according to an exemplary embodiment of the present inventive concept.
Figure 6B:
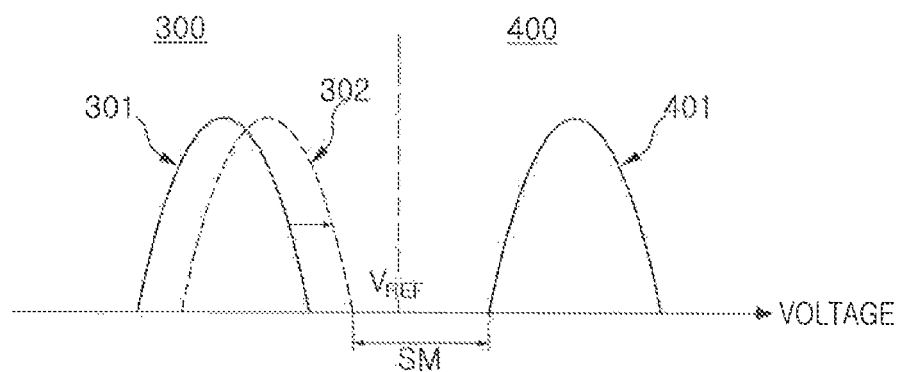

FIGS. 6A and 6B are views illustrating an operation of a memory device according to an exemplary embodiment of the present inventive concept.

First, referring to FIG. 6A, a set reading voltage distribution 300 that is detected when a reading current is input to memory cells MC in a set state is illustrated. In addition, a reset reading voltage distribution 400 that is detected when a reading current is input to memory cells MC in a reset state is illustrated. In an exemplary embodiment of the present inventive concept, the set state may be a state in which a data storage element 214 has a crystalline phase, and the reset state may be a state in which the data storage element 214 has an amorphous phase. In the set state, the data storage element 214 has a relatively lower resistance, so that the set reading voltage distribution 300 may be smaller than the reset reading voltage distribution 400.

The embodiment illustrated in FIG. 6A is an ideal case in which a drift phenomenon, or the like, does not occur in a switching device, or the like. In this case, the set reading voltage distribution 300 may have a first set distribution 301, and the reset reading voltage distribution 400 may have a first reset distribution 401. Referring to FIG. 6A, a predetermined sensing margin SM may be present between the first set distribution 301 and the first reset distribution 401. A memory controller 220 compares a reading voltage detected in memory cells MC with a reference voltage $V_{REF}$ located in the sensing margin SM, thereby determining a state of a memory cell MC as one of a set state and a reset state.

Next, the embodiment illustrated in FIG. 6B may correspond to a case in which a drift phenomenon occurs in a switching device of a memory cell MC having a set state. Referring to FIG. 6B, due to a drift phenomenon occurring in a switching device of a memory cell MC, the set reading voltage distribution 300 may be increased from the first set distribution 301 to a second set distribution 302. Compared with FIG. 6A, as the set reading voltage distribution 300 is increased to the second set distribution 302, the sensing margin SM may be reduced. When a difference between the first set distribution 301 and the second set distribution 302 is great, a portion of the second set distribution 302 may overlap the reference voltage $V_{REF}$, and an error may occur in a reading operation in which a memory controller 220 reads data from a memory cell MC.

FIGS. 7A, 7B, 8A, and 8B are views illustrating a reading operation of a memory device according to an exemplary embodiment of the present inventive concept.

Figure 7A:
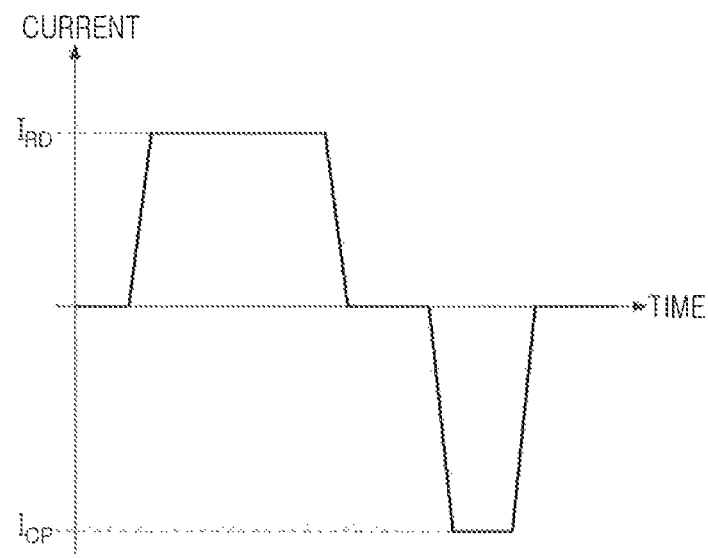
FIGS. 7A, 7B, 8A, and 8B are views illustrating a reading operation of a memory device according to an exemplary embodiment of the present inventive concept.
Figure 7B:
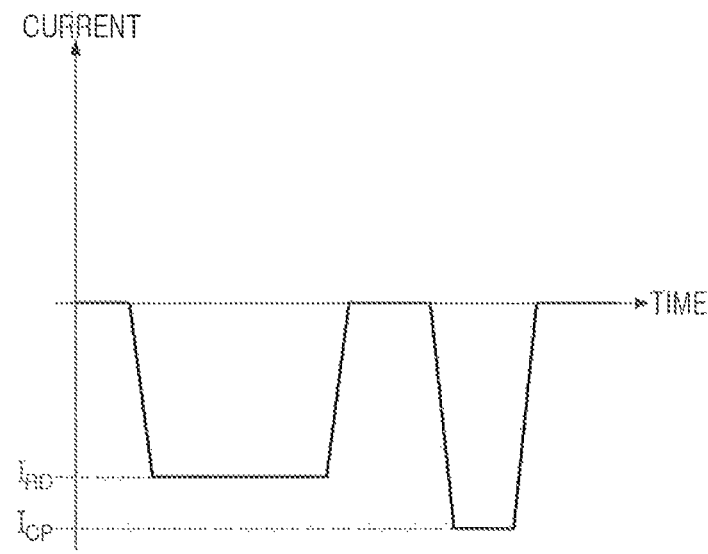

First, referring to FIGS. 7A and 7B, in an exemplary embodiment of the present inventive concept, after a reading current $I_{RD}$ is input, a compensation current $I_{CP}$ may be input. Referring to FIG. 7A, the compensation current $I_{CP}$ may be input in an opposite direction to the reading current $I_{RD}$. For example, the reading current $I_{RD}$ may be input to flow to a data storage device 214 from a switching element 215 in a memory cell MC, and the compensation current $I_{CP}$ may be input to flow to the switching element 215 from the data storage device 214 in the memory cell MC. Thus, the compensation current $I_{CP}$ may turn on the switching element 215 while significantly reducing an effect on the data storage element 214, and may remove a drift phenomenon occurring in the switching element 215.

Next, referring to FIG. 7B, the compensation current $I_{CP}$ and the reading current $I_{RD}$ may be input in the same direction. In an exemplary embodiment of the present inventive concept illustrated in FIG. 7B, the compensation current $I_{CP}$ and the reading current $I_{RD}$ may be input to flow to a switching element 215 from a data storage element 214 in a memory cell MC. Thus, heat generated by a heater of the memory cell MC by the reading current $I_{RD}$ may be significantly reduced, and a phase change phenomenon, which may occur in the data storage element 214, may be effectively suppressed. Moreover, using the compensation current $I_{CP}$, a drift phenomenon, occurring in the switching element 215, may be removed.

Figure 8A:
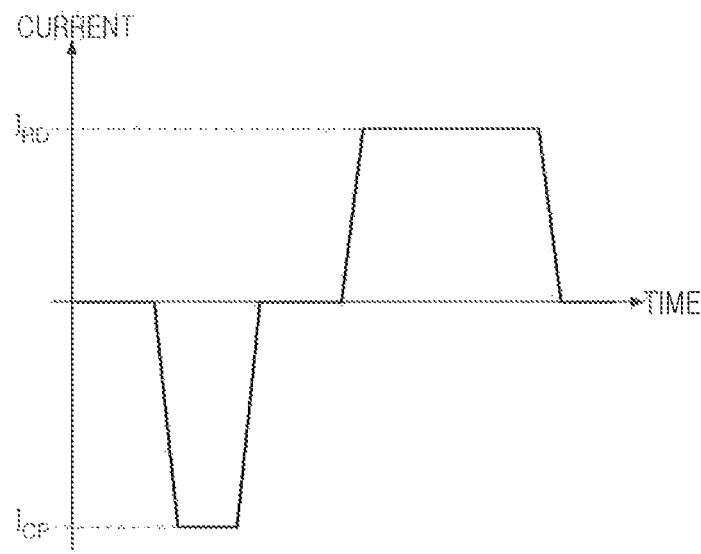
Figure 8B:
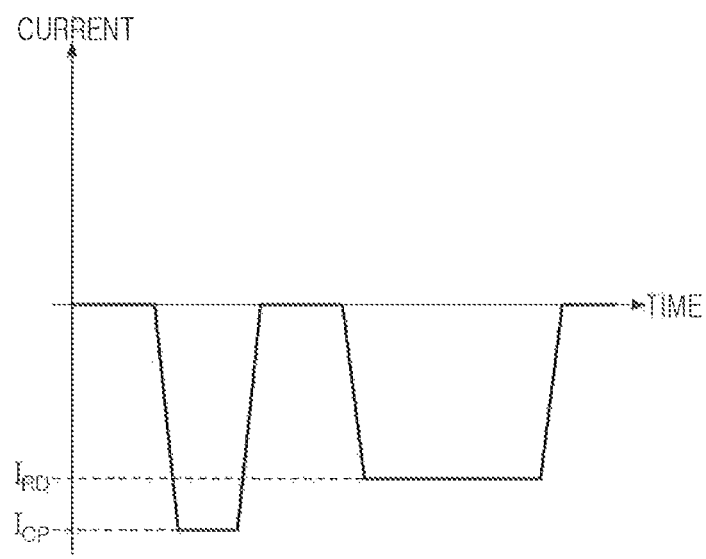

Additionally, in an exemplary embodiment of the present inventive concept illustrated in FIGS. 8A and 8B, before a reading current $I_{RD}$ is input, a compensation current $I_{CP}$ may be input. Referring to FIG. 8A, the compensation current $I_{CP}$ may be input in an opposite direction to the reading current $I_{RD}$. For example, the reading current $I_{RD}$ may be input to flow to a data storage element 214 from a switching element 215 in a memory cell MC, and the compensation current $I_{CP}$ may be input to flow to the switching element 215 from the data storage element 214 in the memory cell MC. Thus, the compensation current $I_{CP}$ may turn on the switching element 215 while significantly reducing an effect on the data storage element 214, and may remove a drift phenomenon occurring in the switching element 215.

In the embodiment illustrated in FIG. 8B, the compensation current $I_{CP}$ and the reading current $I_{RD}$ may be input in the same direction. For example, in FIG. 8B, the compensation current $I_{CP}$ and the reading current $I_{RD}$ may be input to flow to a switching element 215 from a data storage element 214 in a memory cell MC. Thus, heat generated by a heater of the memory cell MC by the reading current $I_{RD}$ may be significantly reduced, and a phase change phenomenon, which may occur in the data storage element 214, may be effectively suppressed. Moreover, using the compensation current $I_{CP}$, a drift phenomenon, occurring in the switching element 215, may be removed.

In the embodiments described with reference to FIGS. 7A, 7B, 8A, and 8B, a magnitude of the compensation current $I_{CP}$ may be greater than a magnitude of the reading current $I_{RD}$, and the input time of the compensation current $I_{CP}$ may be shorter than the input time of the reading current $I_{RD}$. For example, the reading current $I_{RD}$ may be less than a first threshold current having a magnitude allowing a phase change in a data storage device 214 to occur, while the compensation current $I_{CP}$ may be greater than the first threshold current. However, according to various embodiments of the present inventive concept, the magnitude and input time of the compensation current $I_{CP}$ may be variously modified. In an exemplary embodiment of the present inventive concept, the compensation current $I_{CP}$ may be input to memory cells MC by a pulse generated multiple times.

Figure 9A:
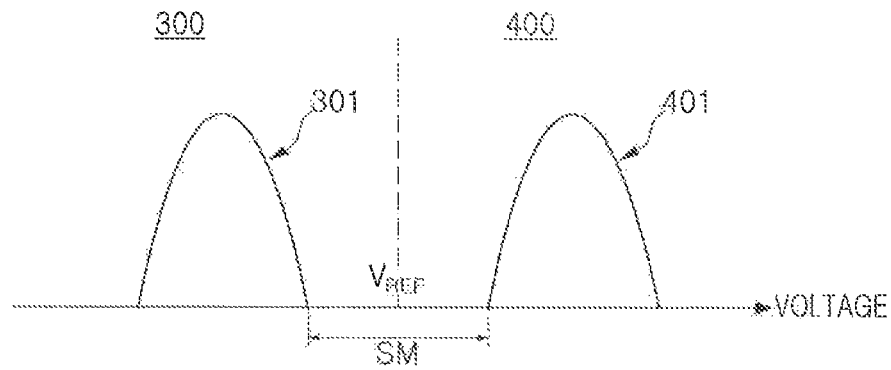
FIGS. 9A, 9B, and 9C are views illustrating a reading voltage distribution of a memory device according to an exemplary embodiment of the present inventive concept.
Figure 9B:
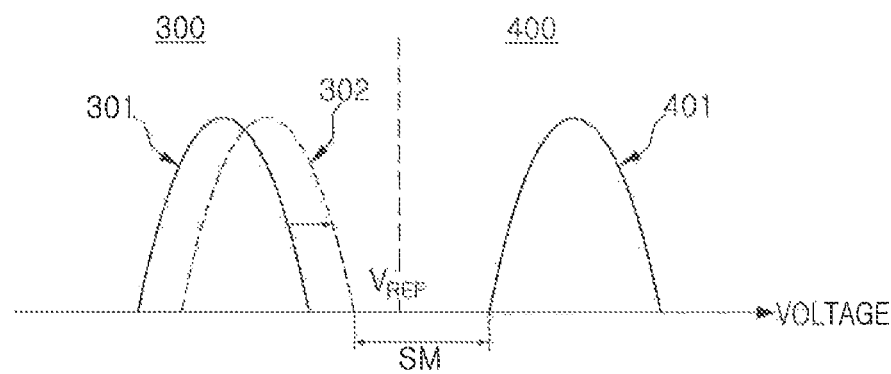
Figure 9C:
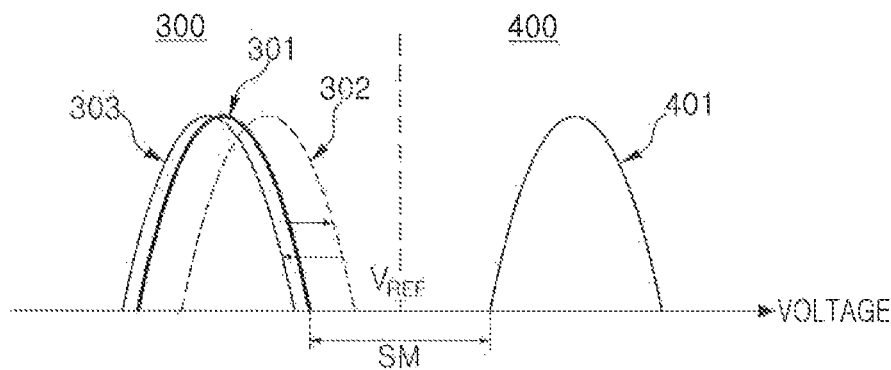

FIGS. 9A, 9B, and 9C are views illustrating a reading voltage distribution of a memory device according to an exemplary embodiment of the present inventive concept.

For example, FIGS. 9A, 9B, and 9C are views illustrating a set reading voltage distribution 300 and a reset reading voltage distribution 400, detected in memory cells Mc. Referring to FIG. 9A, a predetermined sensing margin SM may be present between the first set distribution 301 and the first reset distribution 401. A memory controller 220 may compare a reading voltage, obtained by inputting a reading current $I_{RD}$ to memory cells MC, with a reference voltage $V_{REF}$, present in the sensing margin SM, thereby reading data of memory cells MC.

In an exemplary embodiment of the present inventive concept, as illustrated in FIG. 9B, the set reading voltage distribution 300 may be increased to the second set distribution 302 by a variety of factors. In an exemplary embodiment of the present inventive concept, the set reading voltage distribution 300 may be increased by a drift phenomenon occurring in a switching element 215, a soft program phenomenon in which a weak phase change occurs in a data storage element 214 by a reading current $I_{RD}$, or the like. When the set reading voltage distribution 300 is increased and the sensing margin SM is reduced, an inaccurate reading operation may occur. In an exemplary embodiment of the present inventive concept, before or after a reading current $I_{RD}$ is input, a compensation current $I_{CP}$ is input to memory cells MC, thereby allowing an accurate reading operation to take place.

FIG. 9C is a view illustrating a reading voltage distribution of memory cells MC, after inputting a compensation current $I_{CP}$. Referring to FIG. 9C, when a compensation current $I_{CP}$ is input before or after a reading current $I_{RD}$ is input, a drift phenomenon of a switching element 215, or the like, may be removed. Thus, the set reading voltage distribution 300 may be reduced from the second set distribution 302 to a third set distribution 303. Thus, a sensing margin SM between the set reading voltage distribution 300 and the reset reading voltage distribution 400 may be increased, so accuracy of a reading operation may be increased.

Figure 10A:
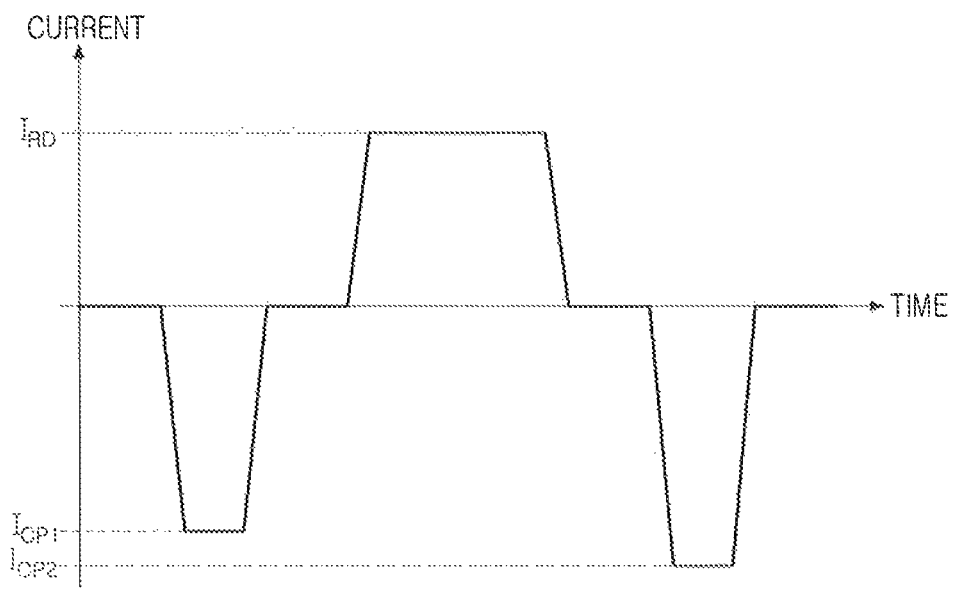
FIGS. 10A and 10B are views illustrating a reading operation of a memory device according to an exemplary embodiment of the present inventive concept.
Figure 10B:
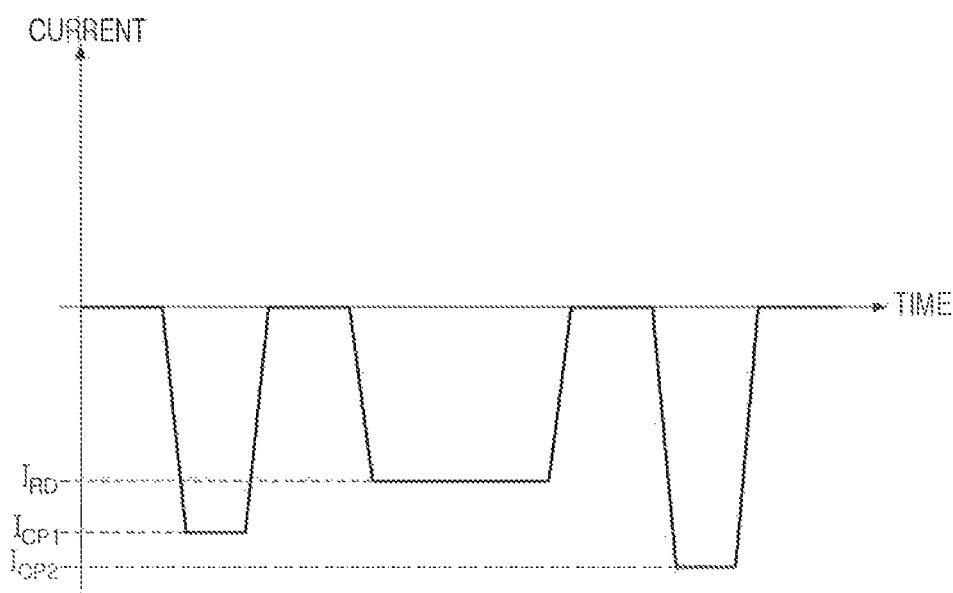

FIGS. 10A and 10B are views illustrating a reading operation of a memory device according to an exemplary embodiment of the present inventive concept.

First, referring to FIGS. 10A and 10B, in an exemplary embodiment of the present inventive concept, before and after a reading current $I_{RD}$ is input, a first compensation current $I_{CP1}$ and a second compensation current $I_{CP2}$ may be input. In the embodiment illustrated in FIG. 10A, the first compensation current $I_{CP1}$ and the second compensation current $I_{CP2}$ may be input in a direction opposite to the reading current $I_{RD}$. For example, the reading current $I_{RD}$ may be input to flow to a data storage element 214 from a switching element 215 in a memory cell MC, while the first compensation current $I_{CP1}$ and the second compensation current $I_{CP2}$ may be input to flow to the switching element 215 from the data storage element 214 in the memory cell MC. Thus, the first compensation current $I_{CP}$ and the second compensation current $I_{CP2}$ may turn on the switching element 215 while significantly reducing an effect on the data storage element 214, and may remove a drift phenomenon occurring in the switching element 215.

Next, referring to FIG. 10B, the first compensation current $I_{CP1}$ and the second compensation current $I_{CP2}$ as well as the reading current $I_{RD}$ may be input in the same direction. In the embodiment illustrated in FIG. 10B, the first compensation current $I_{CP}$, and the second compensation current $I_{CP2}$ as well as the reading current $I_{RD}$ may be input to flow to a switching element 215 from a data storage element 214 in a memory cell MC. Thus, heat generated by a heater of the memory cell MC by the reading current $I_{RD}$ may be significantly reduced, and a phase change phenomenon, which may occur in the data storage element 214, may be effectively suppressed. Moreover, using the first compensation current $I_{CP1}$ and the second compensation current $I_{CP2}$, a drift phenomenon, occurring in the switching element 215, may be removed.

In FIGS. 10A and 10B, the first compensation current $I_{CP1}$ is illustrated to have a magnitude smaller than that of the second compensation current $I_{CP2}$, but the present inventive concept is not limited thereto. For example, the first compensation current $I_{CP1}$ and the second compensation current $I_{CP2}$ may have the same magnitude, or the first compensation current $I_{CP1}$ may be less than the second compensation current $I_{CP2}$. In addition, the input time of each of the first compensation current $I_{CP1}$ and the second compensation current $I_{CP2}$ may also be variously selected and/or modified.

FIGS. 11A, 11B, 11C, 11D, and 11E are views illustrating a reading voltage distribution of a memory device according to an exemplary embodiment of the present inventive concept.

For example, FIGS. 11A, 11B, 11C, 11D, and 11E are views illustrating a distribution of a reading voltage present when each of the first compensation current $I_{CP1}$ and the second compensation current $I_{CP2}$ are input before and after a reading current $I_{RD}$ is input to memory cells MC, as shown in FIGS. 10A and 10B. Referring to FIGS. 11A, 11B, 11C, 11D, and 11E, a sensing margin SM may be present between a set reading voltage distribution 310 and a reset reading voltage distribution 410 of memory cells MC.

Figure 11A:
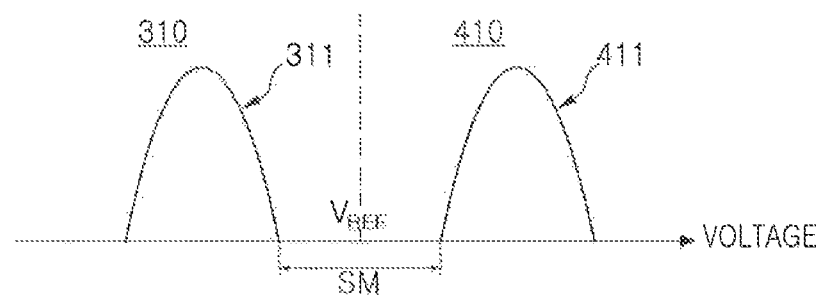
FIGS. 11A, 11B, 11C, 11D, and 11E are views illustrating a reading voltage distribution of a memory device according to an exemplary embodiment of the present inventive concept.

First, referring to FIG. 11A, a reading voltage of memory cells MC having a set state may have a first set distribution 311, and a reading voltage of memory cells MC having a reset state may have a first reset distribution 411. When a distribution of a reading voltage detected from memory cells MC is the same as that of FIG. 10A, a memory controller 220 may obtain a reading voltage by inputting a reading current $I_{RD}$ to memory cells MC, and may read data of the memory cells MC by comparing the reading voltage with a reference voltage $V_{REF}$. The reference voltage $V_{REF}$ may be a voltage included in the sensing margin SM.

Figure 11B:
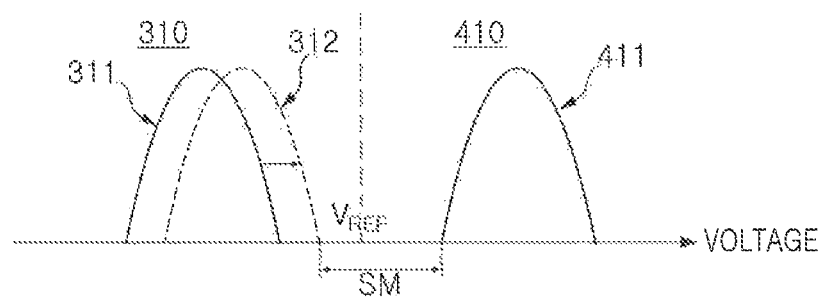

However, in an exemplary embodiment of the present inventive concept, as illustrated in FIG. 11B, the set reading voltage distribution 310 may be changed due to various factors. For example, the set reading voltage distribution 310 may be increased to a second set distribution 312 by a drift phenomenon occurring in a switching element 215, and/or by a soft program phenomenon in which a weak phase change occurs in a data storage element 214 by a reading current $I_{RD}$, and the like. When the set reading voltage distribution 310 is increased to the second set distribution 312 and the sensing margin SM is reduced, a reading operation may not be accurate. In an exemplary embodiment of the present inventive concept, before and after a reading current $I_{RD}$ is input, a first compensation current $I_{CP1}$ and a second compensation current $I_{CP2}$ are input to the memory cells MC, so that accurate reading may take place.

Figure 11C:
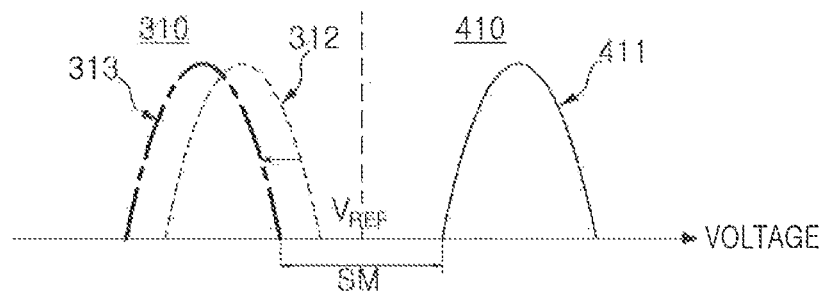

FIG. 11C is a view illustrating a reading voltage distribution of memory cells MC, after inputting a first compensation current $I_{CP1}$. Referring to FIG. 11C, when a first compensation current $I_{CP1}$ is input before a reading current $I_{RD}$ is input, a drift phenomenon of a switching element 215, or the like, may be removed, and the set reading voltage distribution 310 may be reduced from the second set distribution 312 to a third set distribution 313. Thus, a sensing margin SM between the set reading voltage distribution 310 and the reset reading voltage distribution 410 may be increased, so that the reading operation may be more accurate.

Figure 11D:
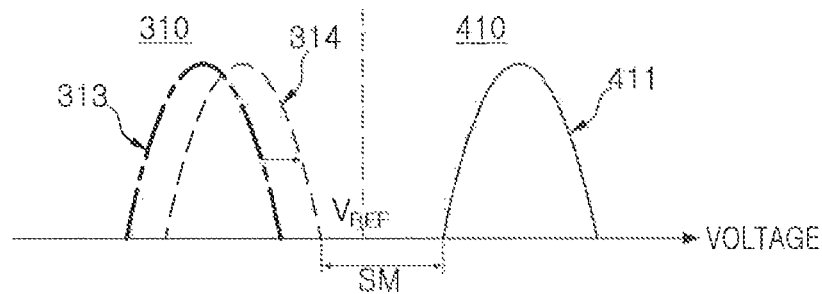

Next, referring to FIG. 11D, a weak phase change may occur in a data storage element 214 of a memory cell MC by a reading current $I_{RD}$, so that the set reading voltage distribution 310 may be increased from the third set distribution 313 to a fourth set distribution 314. Due to a soft program phenomenon caused by the reading current $I_{RD}$, the sensing margin SM may be reduced. Accordingly, the accuracy of a reading operation, subsequently executed, may drop.

Figure 11E:
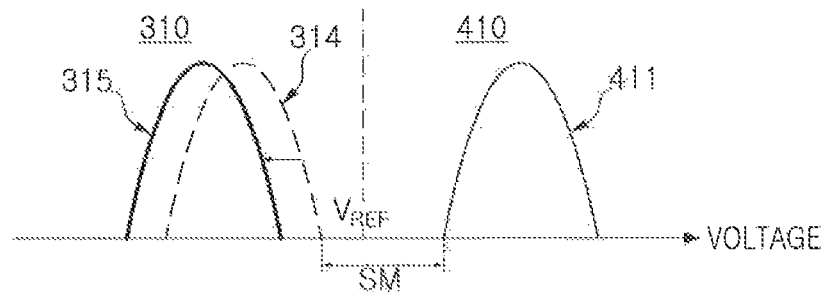

In an exemplary embodiment of the present inventive concept, after data of memory cells MC is read by inputting the reading current $I_{RD}$, the second compensation current $I_{CP2}$ is input; therefore, the reduction in sensing margin SM, described above, may be compensated. Referring to FIG. 11E, the set reading voltage distribution 310 may be reduced to a fifth set distribution 315 by the second compensation current $I_{CP2}$, so that the sensing margin SM may be increased. Thus, a sufficient sensing margin SM may be secured in a reading operation, subsequently executed, and an error rate of the reading operation may be significantly reduced.

Figure 12A:
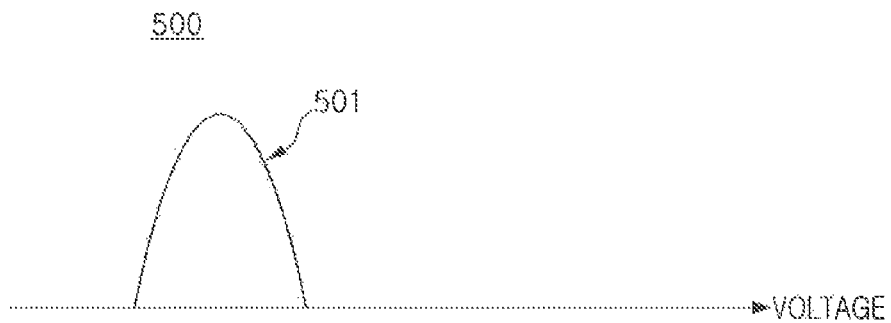
FIGS. 12A, 12B, and 12C are views illustrating an operation of a memory device according to an exemplary embodiment of the present inventive concept.
Figure 12B:
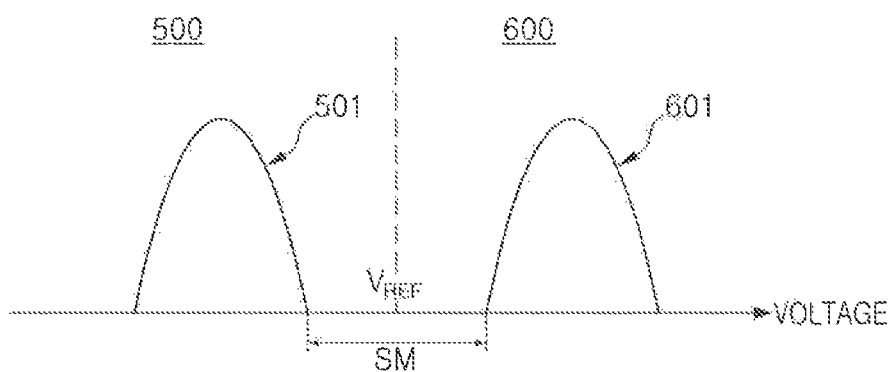
Figure 12C:
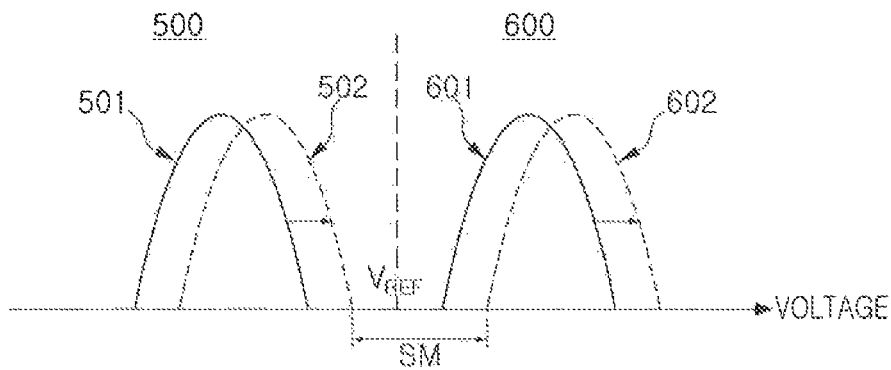

FIGS. 12A, 12B, and 12C are views illustrating an operation of a memory device according to an exemplary embodiment of the present inventive concept.

Referring to FIGS. 12A, 12B, and 12C, a set reading voltage distribution 500 detected in memory cells MC having a set state, and a reset reading voltage distribution 600 detected in memory cells MC having a reset state are illustrated. A set reading voltage and a reset reading voltage may be voltages detected by inputting a predetermined reading current to memory cells MC having a set state and memory cells MC having a reset state, respectively. As mentioned previously, memory cells MC in a set state have a relatively lower resistance than memory cells MC in a reset state; therefore, the set reading voltage distribution 500 may be smaller than the reset reading voltage distribution 600.

FIG. 12A is a graph illustrating a state in which memory cells MC included in a memory device are not programmed. In other words, FIG. 12A may correspond to a state in which all memory cells MC have a set state, so the set reading voltage distribution 500 may only be present.

FIG. 12B is a graph illustrating a state in which a portion of memory cells MC included in a memory device is programmed and switched to a reset state. Referring to FIG. 12B, the reset reading voltage distribution 600 exists with the set reading voltage distribution 500, the set reading voltage distribution 500 has a first set distribution 501, and the reset reading voltage distribution 600 has a first reset distribution 601. A sensing margin SM may be present between the first set distribution 501 and the first reset distribution 601. A memory device may compare a reading voltage, detected from each of memory cells MC, with a predetermined reference voltage $V_{REF}$ included in the sensing margin SM, so that a reading operation for reading data programmed in each of the memory cells MC may be performed.

Since a sensing margin SM between the set reading voltage distribution 500 and the reset reading voltage distribution 600 is large, an error rate of a reading operation may be reduced. In a memory device according to an exemplary embodiment of the present inventive concept, by performing a programming operation to write data to a memory cell MC, a data storage element 214 included in the memory cell MC may be changed from a crystalline phase to an amorphous phase. However, it may take more time until the data storage element 214 is stabilized in an amorphous phase and thus a resistance of the memory cell MC is increased. Thus, immediately after a programming operation, as illustrated in FIG. 12B, the sensing margin SM may not be sufficiently secured.

FIG. 12C is a graph illustrating the set reading voltage distribution 500 and the reset reading voltage distribution 600, after a programming operation is terminated and the time has elapsed. As described previously, since a programming operation is terminated and the time has elapsed, a data storage element 214 of memory cells MC, switched to a reset state, may be stabilized in an amorphous phase. Thus, as illustrated in FIG. 12C, the reset reading voltage distribution 600 may be increased from the first reset distribution 601 to the second reset distribution 602.

However, the aforementioned time is required until the memory cells MC, which were programmed to a reset state, are stabilized. Thus, the reset reading voltage distribution 600 is increased. In this case, immediately after the programming operation, the sensing margin SM may not be effectively secured. Moreover, as the programming operation is terminated and the time has elapsed, due to a drift phenomenon occurring in a switching element 215 of the memory cells MC, a resistance of the memory cells MC may be increased. For example, due to the drift phenomenon occurring in the memory cells MC having a set state, a resistance of the memory cells MC in a set state may be increased. Thus, as illustrated in FIG. 12C, the set reading voltage distribution 500 may be increased from the first set distribution 501 to the second set distribution 502. Therefore, the sensing margin SM may not be significantly increased as compared to immediately after a programming operation.

In an exemplary embodiment of the present inventive concept, after a program current for writing data to memory cells MC is input, a predetermined compensation current is input to the memory cells MC, so that the issues described above may not happen. Hereinafter, the following description will be made with reference to FIGS. 13, 14A, 14B, and 14C.

Figure 13:
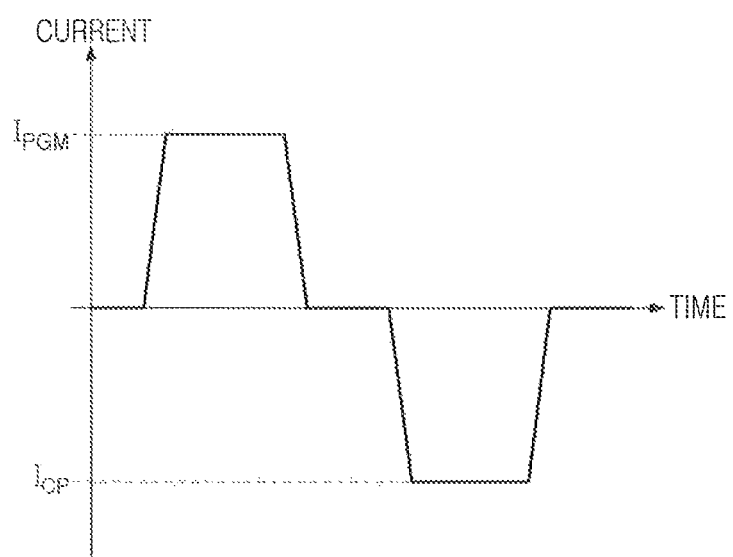
FIG. 13 is a view illustrating a programming operation of a memory device according to an exemplary embodiment of the present inventive concept.

FIG. 13 is a view illustrating a programming operation of a memory device according to an exemplary embodiment of the present inventive concept, and FIG. 14 is a view illustrating a reading voltage distribution of a memory device according to an exemplary embodiment of the present inventive concept.

First, referring to FIG. 13, in an exemplary embodiment of the present inventive concept, after a program current $I_{PGM}$ is input, a compensation current $I_{CP}$ may be input. The compensation current $I_{CP}$ may be input in an opposite direction to the program current $I_{PGM}$. For example, the program current $I_{PGM}$ may be input to flow to a data storage element 214 from a switching element 215 in a memory cell MC, and the compensation current $I_{CP}$ may be input to flow to the switching element 215 from the data storage element 214 in the memory cell MC.

In an exemplary embodiment of the present inventive concept, the compensation current $I_{CP}$ may be input to memory cells MC in a reset state, in which a data storage element 214 is transformed to an amorphous phase by the program current $I_{PGM}$. By the compensation current $I_{CP}$, the data storage element 214, included in the memory cells MC in a reset state, may be quickly stabilized in an amorphous phase, so that a resistance of the memory cells MC in a reset state may be rapidly increased. Thus, a sensing margin may be secured quickly after a programming operation, and a memory device may be operated correctly.

Moreover, in an exemplary embodiment of the present inventive concept, the compensation current $I_{CP}$ may be input to memory cells MC in a set state to which the program current $I_{PGM}$ is not input, in addition to the memory cells MC in a reset state. The compensation current $I_{CP}$, input to the memory cells MC in a set state, may remove a drift phenomenon occurring in a switching element 215. Thus, the compensation current $I_{CP}$ may prevent a resistance of the memory cells MC in a set state from increasing. As a result, a sensing margin between the memory cells MC in a set state and the memory cells MC in a reset state may be increased.

The magnitude and input time of the compensation current $I_{CP}$ may be variously determined. For example, the magnitude and input time of the compensation current $I_{CP}$ may be similar to the magnitude and input time of the program current $I_{PGM}$. The program current $I_{PGM}$ and the compensation current $I_{CP}$ may be greater than a first threshold current having a magnitude capable of causing a phase change in a data storage element 214.

Figure 14A:
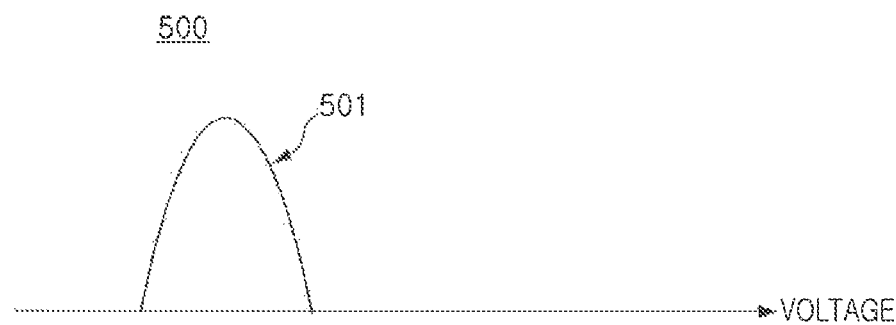
FIGS. 14A, 14B, and 14C are views illustrating a reading voltage distribution of a memory device according to an exemplary embodiment of the present inventive concept.
Figure 14B:
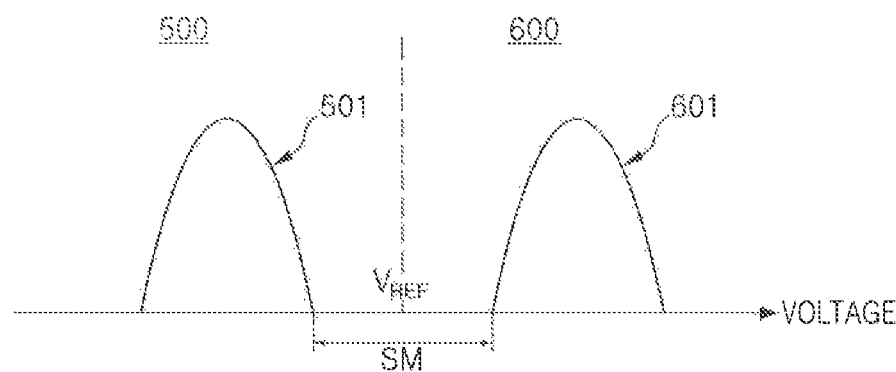
Figure 14C:
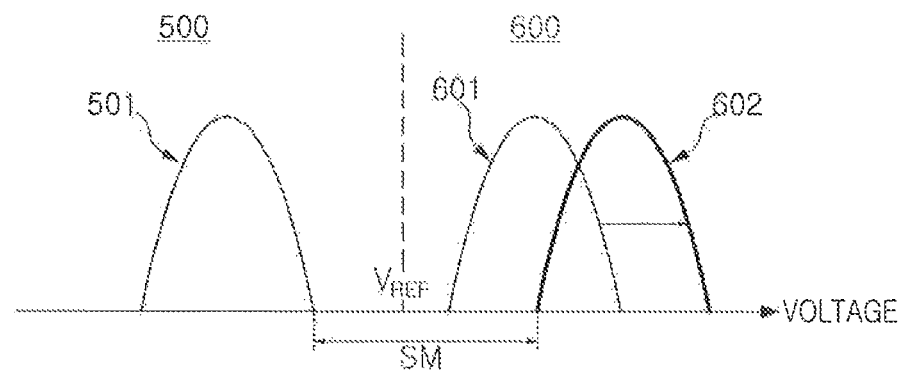

FIGS. 14A, 14B, and 14C are views illustrating a distribution of a reading voltage detected by inputting a predetermined reading current to memory cells MC. First, referring to FIG. 14A, before a programming operation is executed, a set reading voltage distribution 500 may only be present. When the program current $I_{PGM}$ is input to a portion of memory cells MC, as illustrated in FIG. 14B, the reset reading voltage distribution 600 may be obtained with the set reading voltage distribution 500. The set reading voltage distribution 500 may have a first set distribution 501, the reset reading voltage distribution 600 may have a first reset distribution 601, and a sensing margin SM may be present between the first set distribution 501 and the first reset distribution 601.

In an exemplary embodiment of the present inventive concept, after the program current $I_{PGM}$ is input, the compensation current $I_{CP}$ may be input to memory cells MC. As described previously, the compensation current $I_{CP}$ may only be input to memory cells MC in a reset state, or may be input to memory cells MC in a reset state and memory cells MC in a set state.

The compensation current $I_{CP}$, which is input to the memory cells MC in a reset state, may allow a data storage element 214 of the memory cells MC having a reset state to be rapidly stabilized in an amorphous phase. Thus, as illustrated in FIG. 14C, due to the compensation current $I_{CP}$, the reset reading voltage distribution 600 quickly increases to a second reset distribution 602 and is stabilized.

Moreover, in an exemplary embodiment of the present inventive concept, the compensation current $I_{CP}$ may be input to the memory cells MC in a set state after a programming operation. The compensation current $I_{CP}$, which is input to the memory cells MC in a set state, may remove a drift phenomenon occurring in a switching element 215 of the memory cells MC having a set state. The drift phenomenon may increase a resistance of the memory cells MC; therefore, the compensation current $I_{CP}$ may significantly reduce an increase in the set reading voltage distribution 500 from the first set distribution 501.

In summary, due to the compensation current $I_{CP}$, an increase in the set reading voltage distribution 500 may be significantly reduced, and thus, the reset reading voltage distribution 600 may be rapidly increased and stabilized. Thus, as illustrated in FIG. 14C, a sensing margin SM may be increased. As a result, accuracy of a reading operation of a memory device may be improved.

In various exemplary embodiments of the present inventive concept, before and/or after an operating current is input to memory cells MC, a compensation current is input to the memory cells MC, so that various effects may be obtained. In an exemplary embodiment of the present inventive concept, an operating current may be a reading current for reading data from memory cells MC, or a program current for writing data to memory cells MC. The magnitude and input time of the compensation current may be variously selected in consideration of the magnitude and input time of the operating current.

The compensation current may be input to a memory cell MC, to flow to a switching element 215 from a data storage element 214 in the memory cell MC. According to exemplary embodiments of the present inventive concept, a direction in which a compensation current flows may be the same as or different from a direction in which an operating current flows. When the operating current is the program current, the compensation current may flow in an opposite direction of the operating current. When the operating current is the reading current, the operating current and the compensation current may flow in the same direction or in a different direction.

For example, a compensation current, input before and/or after a reading current, may compensate for a drift phenomenon occurring in a memory cell MC having a set state, a soft program phenomenon in which a switching element 215 is turned on by a reading current and a portion of a data storage element 214 is switched to an amorphous phase, or the like. Additionally, a compensation current, supplied after a program current, may allow a data storage element 214 in a memory cell MC in a reset state to be quickly stabilized, thereby contributing to securing a sensing margin.

Figure 15:
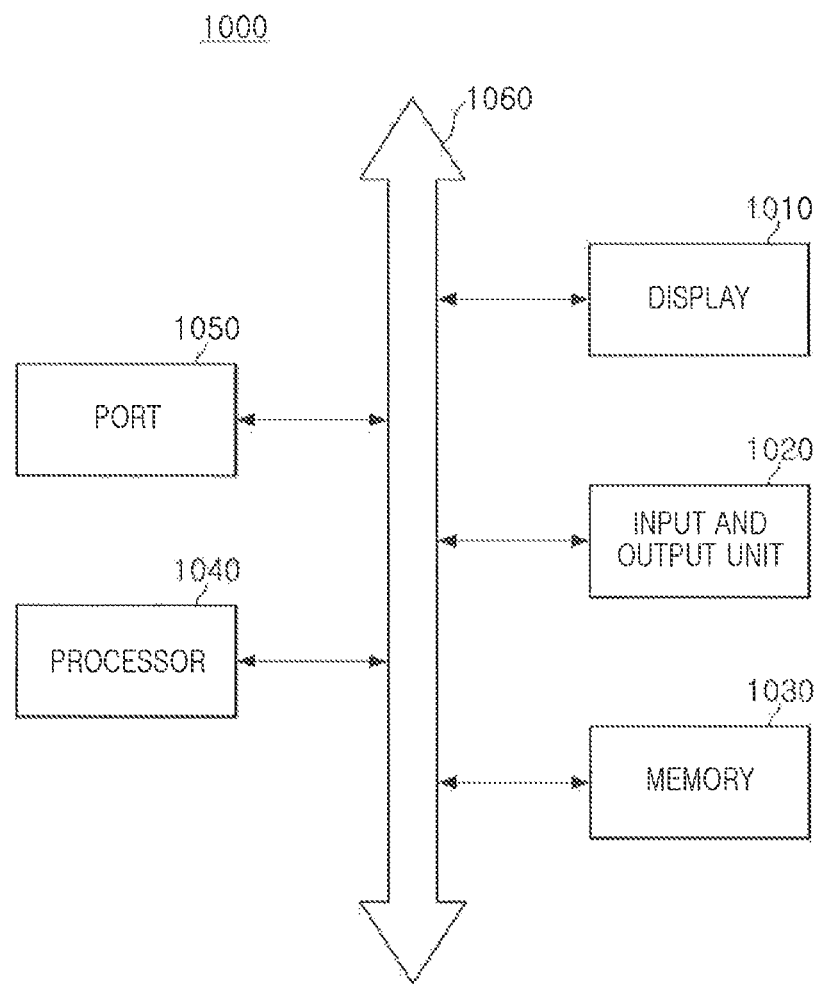
FIG. 15 is a block diagram illustrating an electronic device of a memory device according to an exemplary embodiment of the present inventive concept.

FIG. 15 is a block diagram illustrating an electronic device of a memory device according to an exemplary embodiment of the present inventive concept.

An electronic device 1000 according to an exemplary embodiment of the present inventive concept illustrated in FIG. 15 may include a display 1010, an input-output unit 1020, a memory 1030, a processor 1040, a port 1050, and the like. The components, such as the display 1010, the input-output unit 1020, the memory 1030, the processor 1040, the port 1050, and the like, may communicate with each other through a bus 1060. In addition to the components described above, the electronic device 1000 may further include a power supply unit, a communications unit, a sensor unit, or the like.

The processor 1040 may perform a specific operation, a command, a task, or the like. The processor 1040 may be a central processing unit (CPU), a microprocessor unit (MCU), an application processor (AP), or the like, and may communicate with other components such as the display 1010, the input-output unit 1020, the memory 1030, the port 1050, or the like, through the bus 1060.

The memory 1030 included in the electronic device 1000 illustrated in FIG. 15 may include a memory device according to various exemplary embodiments of the present inventive concept. For example, the memory 1030 may be implemented as a memory device according to the exemplary embodiments described with reference FIGS. 1 to 14. The memory 1030 may include a plurality of memory cells MC, and may input a predetermined compensation current to memory cells MC, before and/or after an operating current for performing a control operation such as read/program, or the like, is input. The compensation current may compensate for a drift phenomenon occurring in memory cells MC, a soft program phenomenon, or the like, or may quickly stabilize memory cells MC programmed to a reset state, thereby contributing to securing a sensing margin required for a reading operation.

As set forth above, according to exemplary embodiments of the present inventive concept, a predetermined compensation current may be input before and/or after a control operation such as reading data from a memory cell MC or writing data to a memory cell MC, and a compensation current may flow to a switching device from a data storage device in the memory cell MC. Thus, a sensing margin of the memory cell MC may be effectively secured before and/or after a control operation is executed, and a memory device may be stably operated.

While the present inventive concept has been described with reference to exemplary embodiments thereof, it will be apparent to those skilled in the art that modifications and variations could be made thereto without departing from the scope of the present inventive concept, as defined by the appended claims.

What is claimed is:

1. A memory device, comprising:
a memory cell array including a plurality of memory cells, wherein each of the plurality of memory cells includes a switching element, and a data storage element connected to the switching element, wherein the data storage element includes a phase change material; and
a memory controller configured to perform a control operation with respect to a first memory cell of the plurality of memory cells by inputting an operating current to the first memory cell, and inputting a compensation current flowing from the data storage element to the switching element in the first memory cell before or after inputting the operating current to the first memory cell,
wherein a direction in which the compensation current flows is opposite to a direction in which the operating current flows, wherein the compensation current flows from the data storage element to the switching element and the operating current flows from the switching element to the data storage element.

2. The memory device of claim 1, wherein the control operation includes a reading operation for reading data stored in the first memory cell and a programming operation for storing data in the first memory cell.

3. The memory device of claim 2, wherein, when the control operation is the programming operation, the memory controller inputs the compensation current to the first memory cell after inputting the operating current to the first memory cell.

4. The memory device of claim 3, wherein a magnitude of the compensation current is less than a magnitude of the operating current.

5. The memory device of claim 3, wherein the memory controller inputs the compensation current only when the first memory cell is in a reset state.

6. The memory device of claim 2, wherein, when the control operation is the reading operation, the memory controller inputs the compensation current to the first memory cell before or after inputting the operating current to the first memory cell.

7. The memory device of claim 6, wherein a magnitude of the compensation current is greater than a magnitude of the operating current.

8. The memory device of claim 6, wherein a time for which the compensation current is input to the first memory cell is shorter than a time for which the operating current is input to the first memory cell.

9. The memory device of claim 6, wherein the memory controller inputs the compensation current only when the first memory cell is in a set state.

10. The memory device of claim 1, wherein the compensation current is input to the first memory cell in a plurality of sequentially generated pulses.

11. The memory device of claim 1, wherein the memory controller inputs the compensation current to the first memory cell, before the operating current is input when the first memory cell is in a set state, and inputs the compensation current to the first memory cell after the operating current is input when the first memory cell is in a reset state.

12. The memory device of claim 1, wherein the switching element of the first memory cell includes an ovonic threshold switch (OTS).

13. A memory device, comprising:
a memory cell array including a plurality of memory cells, wherein each of the plurality of memory cells includes a first electrode, a switching element connected to the first electrode, a data storage element connected to the switching element, and a second electrode connected to the data storage element; and
a memory controller configured to read data stored in a first memory cell of the plurality of memory cells by inputting a reading current to the first electrode of the first memory cell, wherein the memory controller is further configured to input a compensation current to the second electrode of the first memory cell before or after inputting the reading current, wherein the reading current flows to the data storage element from the switching element after being input to the first electrode and the compensation current flows to the switching element from the data storage element after being input to the second electrode.

14. The memory device of claim 13, wherein a magnitude of the reading current is less than a magnitude of a first threshold current, wherein the first threshold current causes a phase change in a phase change material included in the data storage element of the first memory cell, and the compensation current is greater than the first threshold current.

15. The memory device of claim 13, wherein a time for which the compensation current is input to the first memory cell is shorter than a time for which the reading current is input to the first memory cell.

16. The memory device of claim 13, wherein the memory controller inputs the compensation current only when the first memory cell is in a set state.

17. A memory device, comprising:
a memory cell array including a plurality of memory cells, wherein each of the plurality of memory cells includes a first electrode, a switching element connected to the first electrode, a data storage element connected to the switching element, and a second electrode connected to the data storage element; and
a memory controller configured to store data in a first memory cell of the plurality of memory cells by inputting a program current to the first electrode of the first memory cell, wherein the memory controller is further configured to input a compensation current to the second electrode of the first memory cell after inputting the program current, wherein the program current flows to the data storage element from the switching element after being input to the first electrode and the compensation current flows to the switching element from the data storage element after being input to the second electrode.

18. The memory device of claim 17, wherein a magnitude of the program current and a magnitude of the compensation current are higher than a magnitude of a first threshold current, wherein the first threshold current causes a phase change in a phase change material included in the data storage element of the first memory cell.

19. The memory device of claim 17, wherein the memory controller inputs the compensation current only when the first memory cell is set to a reset state by the program current.

* * * * *